(12) United States Patent
Bleim

(10) Patent No.: US 11,686,615 B2
(45) Date of Patent: Jun. 27, 2023

(54) LIGHT TO FREQUENCY MODULATORS

(71) Applicant: ams International AG, Jona (CH)

(72) Inventor: Peter Bleim, Unterpremstätten-Zettling (AT)

(73) Assignee: AMS INTERNATIONAL AG, Jona (CH)

( * ) Notice: Subject to any disclaimer, the term of this patent is extended or adjusted under 35 U.S.C. 154(b) by 0 days.

(21) Appl. No.: 17/787,708

(22) PCT Filed: Dec. 7, 2020

(86) PCT No.: PCT/EP2020/084875
§ 371 (c)(1),
(2) Date: Jun. 21, 2022

(87) PCT Pub. No.: WO2021/130005
PCT Pub. Date: Jul. 1, 2021

(65) Prior Publication Data
US 2023/0044817 A1 Feb. 9, 2023

Related U.S. Application Data

(60) Provisional application No. 62/952,934, filed on Dec. 23, 2019.

(51) Int. Cl.
*G01J 1/44* (2006.01)
*H03M 1/10* (2006.01)

(52) U.S. Cl.
CPC ............. *G01J 1/44* (2013.01); *H03M 1/1023* (2013.01); *G01J 2001/446* (2013.01)

(58) Field of Classification Search
CPC ..... G01J 1/44; G01J 2001/446; H03M 1/1023
See application file for complete search history.

(56) References Cited

U.S. PATENT DOCUMENTS 3,959,653 A * 5/1976 Lee .................. G01T 1/185
250/374

FOREIGN PATENT DOCUMENTS

EP 3435046 A1 1/2019

OTHER PUBLICATIONS

International Search Report and Written Opinion in corresponding International Application No. PCT/EP2020/084875 dated Apr. 23, 2021, 11 pages.

* cited by examiner

*Primary Examiner* — Thanh Luu
(74) *Attorney, Agent, or Firm* — MH2 Technology Law Group, LLP

(57) ABSTRACT

A method of measuring light intensity comprising exposing a photodiode to light to cause the photodiode to provide a current of a first polarity, supplying said current to an integrator to integrate said current to provide an integrated output voltage, and comparing the output voltage with a threshold voltage. Charge packages of opposite polarity are applied to said first polarity to reset the integration voltage prior to the start of the integration time. At the end of the integration time, the photodiode is disconnected from said integrator and a reference voltage coupled to the integrator input, whilst a resistance is coupled into the circuit until the comparison signal switches. The comparison signal is monitored to measure a time between the end of the integration time and the switching of the comparison signal to provide a measure of a residual voltage.

7 Claims, 3 Drawing Sheets

LIGHT TO FREQUENCY MODULATORS

CROSS-REFERENCE TO RELATED APPLICATIONS

The present application is the national stage entry of International Patent Application No. PCT/EP2020/084875, filed on Dec. 7, 2020, and published as WO 2021/130005 A1 on Jul. 1, 2021, which claims the benefit of U.S. Provisional Patent Application No. 62/952,934, filed on Dec. 23, 2019, all of which are incorporated by reference herein in their entireties.

TECHNICAL FIELD OF THE DISCLOSURE

The present disclosure relates to light to frequency modulators.

BACKGROUND

An optical sensor arrangement often comprises a photodiode as a light detector and measures a photocurrent flowing through the photodiode. The optical sensor arrangement may convert the photocurrent into a digital signal. For example, the optical sensor arrangement may be realized as a light-to-frequency circuit, also called light-to-frequency machine or engine, abbreviated to LTF engine. The LTF engine may generate the digital signal by integrating the photocurrent and comparing the integrated signal with a threshold using a comparator. The output of the device is a square wave or pulse stream the frequency of which is linearly proportional to the light intensity. In a typical configuration, a processor 12 counts the number of pulses generated by the comparator over a fixed period of time termed the "integration time". The pulse count over the integration time is proportional to the light intensity. The accuracy of the detected digital signal depends on reference values used during integration and comparison.

In a typical LTF engine such as that illustrated in FIG. 1, when the photocurrent is integrated, each time the integrated signal crosses a threshold value, a well-defined charge package with an opposite polarity compared to the photocurrent is provided to an input of an integrator for setting the integration process to a defined state. This process is repeated during the predefined integration time, and each crossing of the threshold is counted during an integration phase. The accuracy of the count is limited by the size of the well-defined charge package. In particular, there will be a period of time between the final pulse within a given integration time and the end of that integration time, i.e during which period there is insufficient time to generate a further pulse.

WO2019011543 describes an improved concept that uses a second, not necessarily well-defined, charge package for determining a residual count of such smaller charge packages between the charging state at the end of the integration phase and the corresponding threshold value. In other words, small charge packages are incrementally added to the integrated charge at the end of the integration time to "count up to" the switching threshold. By combining the primary count obtained at the end of the integration time with the residual count an improved intensity measurement can be obtained. The approach of WO2019011543 is illustrated in FIG. 2 where the top trace illustrates the output voltage of the integrator whilst the lower trace illustrates the output of the comparator.

SUMMARY

According to a first aspect of the present invention there is provided an optical sensor system for measuring light intensity and comprising a photodiode having a photodiode output for providing a current of a first polarity, an integrator having an integrator input selectively coupled to said photodiode output for receiving said current and an integrator output for providing an integrated output voltage, and a comparator having a comparator input coupled to said integrator output and configured to compare the integrated output voltage with a threshold voltage to provide a comparison signal at a comparator output. The system further comprises a reference charge circuit coupled to said comparator output and to said integrator for providing charge packages to said integrator input, the charge packages having a polarity opposite to said first polarity, a reference voltage circuit having a reference voltage output for selectively providing at least a first defined voltage to the integrator input, and a resistance selectively coupled between said integrator input and a reference voltage node to provide a current path between said integrator input and the reference voltage node.

The system is provided with a control unit for (a) operating said integration unit over an integration time during which period said photodiode output is coupled to said integrator input, and said reference voltage circuit does not provide said first defined voltage to the integrator input whilst said resistance does not provide said current path, (b) at the end of the integration time, disconnecting said photodiode output from said integrator input and causing said reference voltage circuit to provide said first defined voltage to said integrator input, whilst said resistance does provide said current path, until the comparison signal switches, The system allows a monitoring unit to monitor a period between the end of the integration time and the switching of the comparison signal which is indicative of a residual voltage on the integrator output at the end of the integration time.

The reference voltage circuit comprises a digital to analogue converter and a digital controller for causing the converter to provide said first defined voltage to the integrator input.

The digital controller may cause said converter to provide an offset voltage, different from said first predefined voltage, to the integrator input during said integration time. The integrator comprises an operational amplifier circuit and said digital to analogue converter is integrated into the operational amplifier circuit.

The system may comprise a circuit or processor coupled to the output of the comparator for measuring the time period between the end of the integration time and the switching of the comparison signal.

The control unit may be configured to apply a charge package to the integrator input while the photodiode is disconnected from the integrator input, couple said resistance between said integrator input and a reference voltage node while the photodiode remains disconnected, cause said reference voltage circuit to provide said first defined voltage to said integrator input, and determine a time to switch the output of the comparator. The determined time provides a calibration time that can be used to determine a residual voltage using said period between the end of the integration time and the switching of the comparison signal.

According to a second aspect of the invention there is provided a method of measuring light intensity. The method comprises the steps of exposing a photodiode to light to cause the photodiode to provide a current of a first polarity, supplying said current to an input of an integrator and using the integrator to integrate said current over an integration time to provide an integrated output voltage, and comparing the integrated output voltage with a threshold voltage to provide a comparison signal. The method comprises applying charge packages of opposite polarity to said first polarity to reset the integration voltage prior to the start of the integration time. At the end of the integration time, the photodiode is disconnected from said integrator and a reference voltage coupled to the integrator input, whilst a resistance is coupled between the integrator input and a reference voltage node, until the comparison signal switches. The comparison signal is monitored to measure a time between the end of the integration time and the switching of the comparison signal to thereby provide a measure of a residual voltage at the end of the integration time.

DETAILED DESCRIPTION

Figure 1:
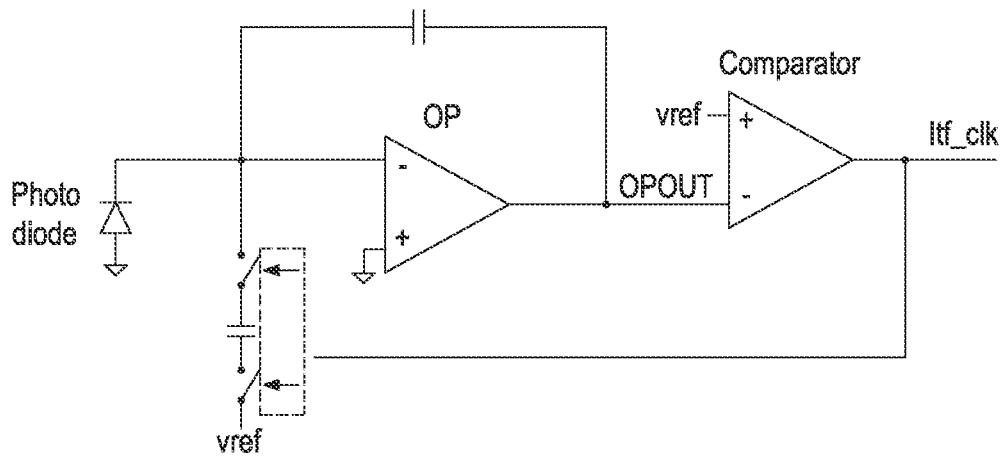
FIG. 1 illustrates schematically a prior art light to frequency modulator circuit.
Figure 2:
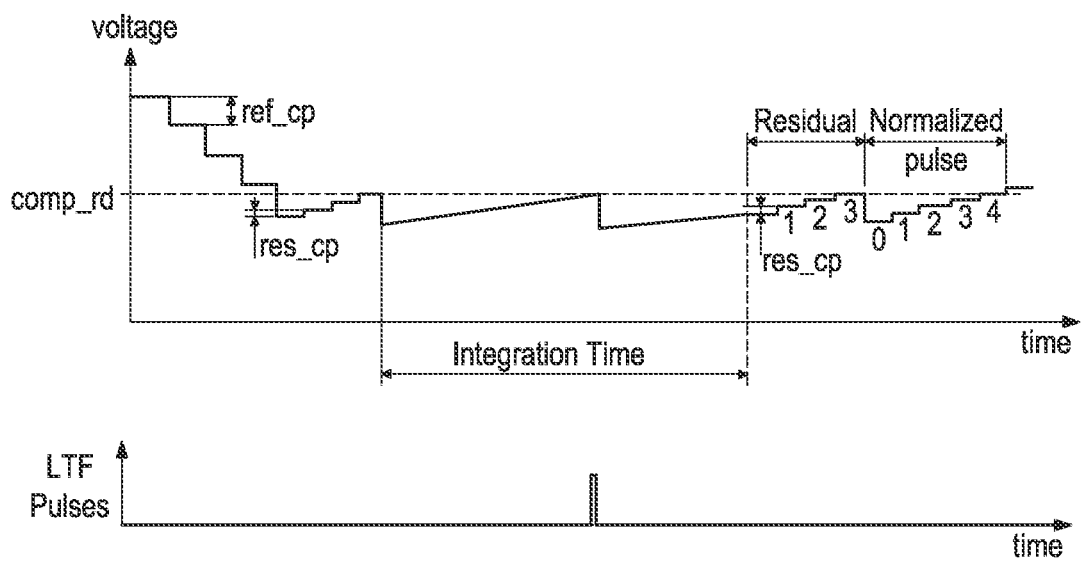
FIG. 2 illustrates traces associated with the operation of a light to frequency modulator circuit that uses a known technique for determining a residual count at the end of an integration time.

As has been explained above with reference to FIG. 1, there is a need for a mechanism to obtain a residual voltage measurement for a light to frequency modulator circuit at the end of each integration time. Whilst mechanisms for this purpose are known, it is desirable to provide a mechanism that reuses, as much as possible, existing circuit components and functions.

Figure 3:
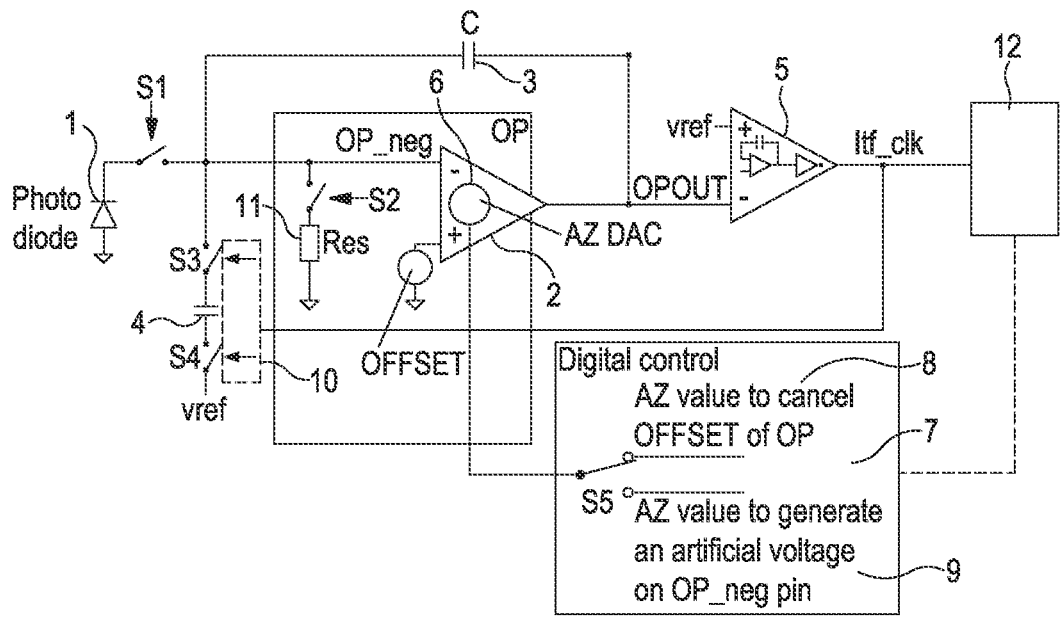
FIG. 3 illustrates schematically an improved light to frequency modulator circuit.

FIG. 3 illustrates schematically a light to frequency modulator circuit comprising a photodiode 1 configured to provide a current of a first polarity upon exposure to light. A switch S1 is operable to connect the photodiode 1 to a negative input of an amplifier 2. A capacitor 3 is coupled between the output of the amplifier 2 and the negative input such that the amplifier acts as an integrator. A further capacitor 4 is coupled between the negative input of the amplifier 2 and a reference voltage Vref by switches S3, S4. The operation of these switches is explained further below. A further switch S2 is configured to connect the negative input of the amplifier 2 to a reference voltage, e.g ground potential, via a resistance 11.

The output of the amplifier 2 is coupled to a negative input of a comparator 5. The positive input of the comparator is coupled to a further reference voltage (which may be the same as Vref mentioned above or may be different. The output of the comparator 2 provides a signal ltf_clk which is used to control switches S3 and S4.

The amplifier 2 comprises an auto-zeroing digital to analogue converter (AZ DAC) 6. This is a known amplifier functionality and is conventionally used to correct offsets in the amplifier. FIG. 3 illustrates a digital controller 7 that comprises a function 8 for determining the offset to be applied. This offset value is signaled to the AZ DAC 6 via a switch S5. The digital controller 7 also comprises functionality 9 for applying a reference voltage to the AZ DAC also via switch S5.

Figure 4:
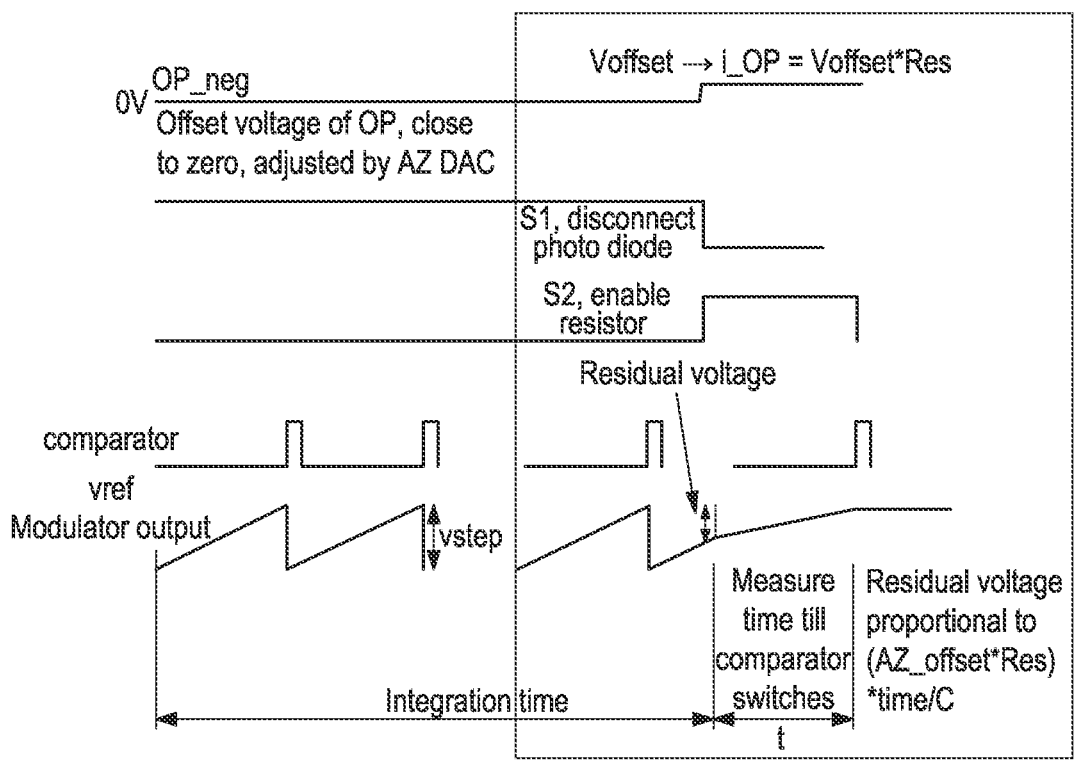
FIG. 4 illustrates traces associated with the operation of the circuit of FIG. 3.

During normal modulator operation the digital controller 7 selects an appropriate offset voltage and applies this to the AZ DAC 6 of the amplifier 2 via switch S5. At the start of each integration period, switch S1 is closed and the photodiode current is integrated into the modulator capacitor 3 for the duration of the integration time. When the comparator reference voltage vref is reached, a predefined charge is applied to the modulator input causing a voltage step down vstep. This is achieved via a control circuit 10 which opens and closes switches S3 and S4 to move charge to and from the capacitor 4. The result is a sequence of pulses in the output signal ltf_clk of the comparator 5. The output of the amplifier 2 (modulator output) and comparator 5 during the integration time are shown in FIG. 4.

At the end of the integration time, the number of pulses detected in the output of the comparator is a measure of the intensity of light to which the comparator has been exposed. However, at this time the output voltage of the amplifier will likely be sitting at some voltage between zero and Vref (the switching voltage of the comparator). In order to more accurately determine the light intensity it is desirable to determine this residual voltage. Therefore, at the end of the integration time switch S1 is opened to prevent the photodiode supplying further current to the amplifier. Substantially simultaneously, switch S2 is closed to connect the negative input of the amplifier 2 to the reference voltage via the resistance 11. Also, and again substantially simultaneously, the digital controller 7 operates switch S5 to cause the AZ DAC to generate an "artificial" voltage and apply this to the negative input of the amplifier. This artificial voltage is a fixed voltage. Switch S2 is also closed such that current flows across the resistor into the negative input of the amplifier.

The current now flowing into the negative input of the amplifier 2 is integrated with the modulator. FIG. 4 illustrates the states of the switches S1 and S2, both changing state at the end of the integration time, as well as a step change in the voltage provided by the AZ DAC. The trace (bottom) showing the amplifier output can be seen to be increasing linearly at a first rate immediately prior to the end of the integration time due to the current provided by the photodiode. At the end of the integration time the rate of increase changes to a second rate, less than the first rate, due to the photodiode being disconnected and the AZ DAC applying the artificial voltage. The time t needed for the output of the amplifier to reach vref can be measured by monitoring the comparator output ltf-clk.

Prior to first operation of the circuit, a calibration step is performed to determine the time tcal taken for the artificial voltage to charge the integrator from zero to vref. The residual voltage at the end of a given integration period is therefore: vstep*(1−t/tcal).

Figure 5:
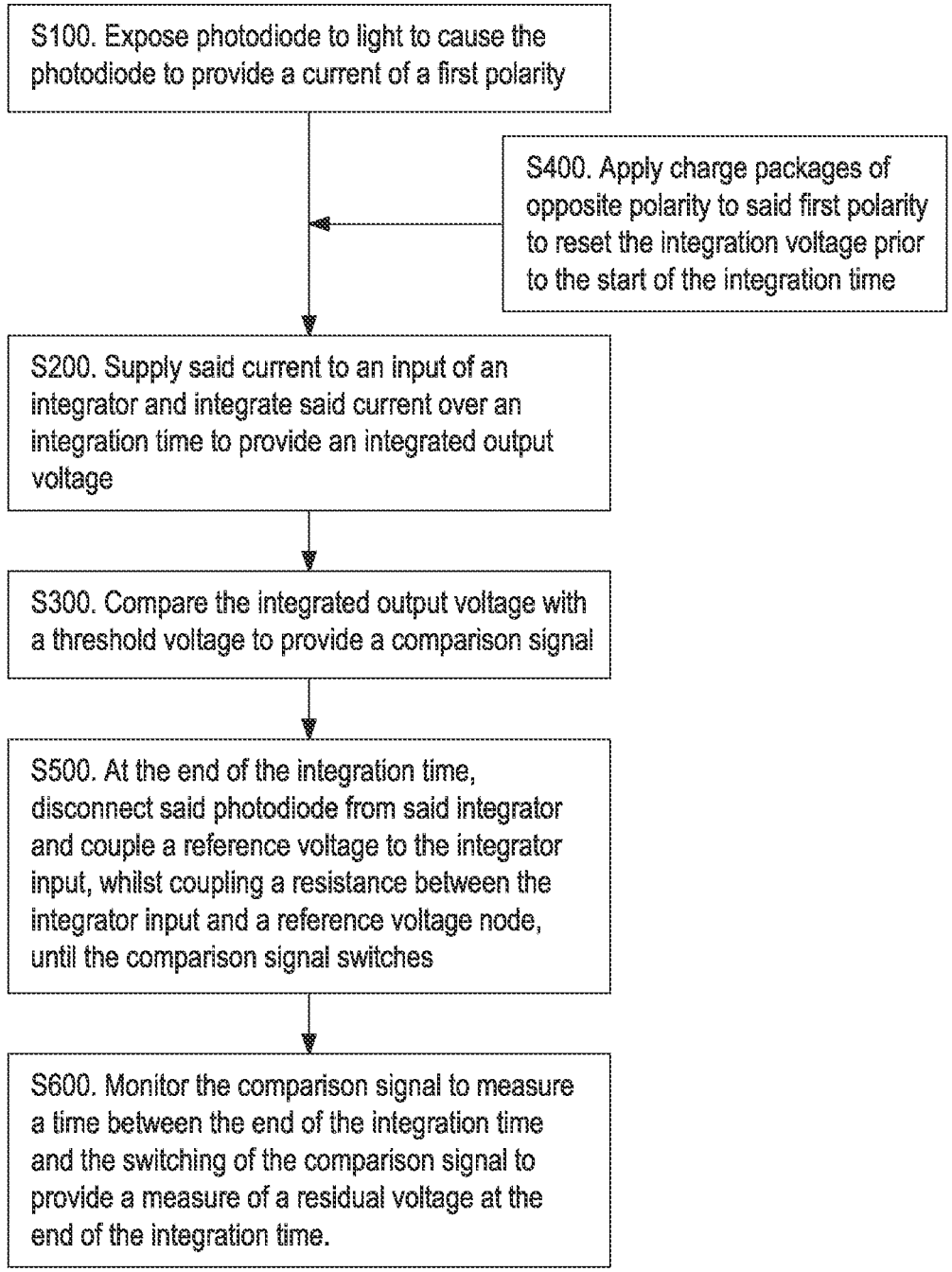
FIG. 5 is a flow diagram illustrating a method of operating a light to frequency modulator circuit to determine a residual voltage.

The method of operation of the circuit is further illustrated in the flow diagram of FIG. 5.

The embodiment presented here has the following advantages over known methods and circuits:
  improved accuracy at low signal counts;
  no need to go to use very high gain gain factors with the consequent disadvantages (e.g. noise)
  the possibility of using reduced integration times.

It will be appreciated by those of skill in the art that various modifications may be made to the above described embodiment without departing from the scope of the present invention.

What is claimed is:

1. An optical sensor system for measuring light intensity and comprising:
    a photodiode having a photodiode output for providing a current of a first polarity;
    an integrator having an integrator input selectively coupled to said photodiode output for receiving said current and an integrator output for providing an integrated output voltage;
    a comparator having a comparator input coupled to said integrator output and configured to compare the integrated output voltage with a threshold voltage to provide a comparison signal at a comparator output;
    a reference charge circuit coupled to said comparator output and to said integrator for providing charge packages to said integrator input, the charge packages having a polarity opposite to said first polarity;
    a reference voltage circuit having a reference voltage output for selectively providing at least a first defined voltage to the integrator input;
    a resistance selectively coupled between said integrator input and a reference voltage node to provide a current path between said integrator input and the reference voltage node; and
    a control unit for
        (a) operating said integration unit over an integration time during which period said photodiode output is coupled to said integrator input, and said reference voltage circuit does not provide said first defined voltage to the integrator input whilst said resistance does not provide said current path,
        (b) at the end of the integration time, disconnecting said photodiode output from said integrator input and causing said reference voltage circuit to provide said first defined voltage to said integrator input, whilst said resistance does provide said current path, until the comparison signal switches,
    wherein a period between the end of the integration time and the switching of the comparison signal is indicative of a residual voltage on the integrator output at the end of the integration time.

2. The system according to claim 1, wherein said reference voltage circuit comprises a digital to analogue converter and a digital controller for causing the converter to provide said first defined voltage to the integrator input.

3. The system according to claim 1, wherein said digital controller causes said converter to provide an offset voltage, different from said first predefined voltage, to the integrator input during said integration time.

4. The system according to claim 3, wherein said integrator comprises an operational amplifier circuit and said digital to analogue converter is integrated into the operational amplifier circuit.

5. The system according to claim 1 comprising a circuit or processor coupled to the output of the comparator for measuring the time period between the end of the integration time and the switching of the comparison signal.

6. The system according claim 1, wherein said control unit is configured to:
    apply a charge package to the integrator input while the photodiode is disconnected from the integrator input;
    couple said resistance between said integrator input and a reference voltage node while the photodiode remains disconnected;
    cause said reference voltage circuit to provide said first defined voltage to said integrator input; and
    determine a time to switch the output of the comparator, whereby the determined time provides a calibration time that can be used to determine a residual voltage using said period between the end of the integration time and the switching of the comparison signal.

7. A method of measuring light intensity and comprising:
    exposing a photodiode to light to cause the photodiode to provide a current of a first polarity;
    supplying said current to an input of an integrator and using the integrator to integrate said current over an integration time to provide an integrated output voltage;
    comparing the integrated output voltage with a threshold voltage to provide a comparison signal;
    applying charge packages of opposite polarity to said first polarity to reset the integration voltage prior to the start of the integration time;
    at the end of the integration time, disconnecting said photodiode from said integrator and coupling a reference voltage to the integrator input, whilst coupling a resistance between the integrator input and a reference voltage node, until the comparison signal switches, and
    monitoring the comparison signal to measure a time between the end of the integration time and the switching of the comparison signal to provide a measure of a residual voltage at the end of the integration time.

* * * * *